(12) United States Patent
Taracila et al.

(10) Patent No.: US 11,719,775 B1
(45) Date of Patent: Aug. 8, 2023

(54) RF RECEIVER COIL WITH EQUAL PERIMETER LOOPS

(71) Applicant: GE PRECISION HEALTHCARE LLC, Wauwatosa, WI (US)

(72) Inventors: Victor Taracila, Beachwood, OH (US); Robert Steven Stormont, Hartland, WI (US); Ravi Shankar Jaiswal, Bangalore (IN); Fraser John Laing Robb, Aurora, OH (US); Ramesh Venkatesan, Bangalore (IN); Emily Rose Long, Milwaukee, WI (US); Jana Michelle Vincent, Aurora, OH (US)

(73) Assignee: GE Precision Healthcare LLC, Wauwatosa, WI (US)

( * ) Notice: Subject to any disclaimer, the term of this patent is extended or adjusted under 35 U.S.C. 154(b) by 0 days.

(21) Appl. No.: 17/587,404

(22) Filed: Jan. 28, 2022

(51) Int. Cl.
*G01R 33/34* (2006.01)
*G01R 33/343* (2006.01)

(52) U.S. Cl.
CPC ..... *G01R 33/34084* (2013.01); *G01R 33/343* (2013.01)

(58) Field of Classification Search
CPC ............. G01R 33/34; G01R 33/34007; G01R 33/34046; G01R 33/34084; G01R 33/341; G01R 33/3415; G01R 33/343; G01R 33/3657
See application file for complete search history.

(56) References Cited

U.S. PATENT DOCUMENTS

| 10,859,648 | B2 | 12/2020 | Robb et al. | |
|---|---|---|---|---|
| 2005/0104591 | A1 | 5/2005 | Qu et al. | |
| 2008/0136412 | A1* | 6/2008 | Kato | G01R 33/34084 |
| | | | | 324/318 |
| 2008/0174314 | A1 | 7/2008 | Holwell et al. | |
| 2013/0137969 | A1 | 5/2013 | Jones | |
| 2014/0091791 | A1 | 4/2014 | Bulumulla et al. | |
| 2014/0197832 | A1 | 7/2014 | Driesel et al. | |
| 2014/0200437 | A1 | 7/2014 | Yager et al. | |
| 2015/0168515 | A1 | 6/2015 | Ishihara et al. | |
| 2017/0074956 | A1* | 3/2017 | Rosen | G01R 33/445 |
| 2018/0335491 | A1 | 11/2018 | Yang et al. | |
| 2019/0154773 | A1 | 5/2019 | Stack et al. | |
| 2019/0154775 | A1 | 5/2019 | Stack et al. | |
| 2019/0277926 | A1 | 9/2019 | Stormont et al. | |
| 2019/0293738 | A1 | 9/2019 | Popescu | |
| 2019/0310327 | A1 | 10/2019 | Stormont et al. | |
| 2019/0353722 | A1 | 11/2019 | Stormont et al. | |
| 2019/0369176 | A1* | 12/2019 | Dalveren | G01R 33/34007 |
| 2019/0377040 | A1* | 12/2019 | Stack | G01R 33/34053 |
| 2020/0081080 | A1 | 3/2020 | Zemskov et al. | |
| 2020/0408860 | A1* | 12/2020 | Taracila | G01R 33/3415 |

FOREIGN PATENT DOCUMENTS

JP 2002102199 A 4/2002
WO WO-2022122269 A1 * 6/2022

* cited by examiner

*Primary Examiner* — Steven L Yeninas
(74) *Attorney, Agent, or Firm* — Fletcher Yoder P.C.

(57) ABSTRACT

An RF receiving coil assembly for a magnetic resonance imaging system includes a flexible enclosure. The RF coil assembly also includes an RF coil enclosed within the flexible enclosure. The RF coil includes a plurality of loops, each loop of the plurality of loops having a same perimeter.

19 Claims, 17 Drawing Sheets

RF RECEIVER COIL WITH EQUAL PERIMETER LOOPS

BACKGROUND

The subject matter disclosed herein relates to medical imaging and, more particularly, to a radio frequency (RF) receiving coil of a magnetic resonance imaging (MRI) system having loops with equal perimeters.

Non-invasive imaging technologies allow images of the internal structures or features of a patient/object to be obtained without performing an invasive procedure on the patient/object. In particular, such non-invasive imaging technologies rely on various physical principles (such as the differential transmission of X-rays through a target volume, the reflection of acoustic waves within the volume, the paramagnetic properties of different tissues and materials within the volume, the breakdown of targeted radionuclides within the body, and so forth) to acquire data and to construct images or otherwise represent the observed internal features of the patient/object.

During MRI, when a substance such as human tissue is subjected to a uniform magnetic field (polarizing field $B_0$), the individual magnetic moments of the spins in the tissue attempt to align with this polarizing field, but process about it in random order at their characteristic Larmor frequency. If the substance, or tissue, is subjected to a magnetic field (excitation field B1) which is in the x-y plane and which is near the Larmor frequency, the net aligned moment, or "longitudinal magnetization", $M_z$, may be rotated, or "tipped", into the x-y plane to produce a net transverse magnetic moment, $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradient fields vary according to the particular localization method being used. The resulting set of received nuclear magnetic resonance (NMR) signals are digitized and processed to reconstruct the image using one of many well-known reconstruction techniques.

Traditionally, older, low field (less than 1 Tesla) MRI systems have been viewed as poorly performing systems due to a variety of factors (e.g., limited spatial resolution associated with poor image quality, limited kinds of image sequences and parameters, inefficient temporal resolution associated with low signal-to-noise ratio (SNR), etc.). However, certain technological advancements (e.g., artificial intelligence aided reconstruction and noise reduction) has drawn new attention to older, low field MRI systems. However, one limiting factor that still exists is the limited availability of receiver coils to be utilized with the low field MRI system. For a low field MRI system, a receiver array needs to have large elements as noise generation by the human body is smaller than intrinsic noise generated by the antenna conductor. This forces the number of elements (e.g., channels) in the field of view (FOV) to be limited.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, an RF receiving coil assembly for a magnetic resonance imaging system is provided. The RF receiving coil assembly includes an RF coil enclosed within the flexible enclosure. The RF coil includes a plurality of loops, each loop of the plurality of loops having a same perimeter.

In another embodiment, an RF coil array assembly for an MRI system is provided. The RF coil array assembly includes a first RF coil including a first plurality of loops, each loop of the first plurality of loops having a first same perimeter. The RF coil array assembly also includes a second RF coil including a second plurality of loops, each loop of the second plurality of loops having a second same perimeter.

In a further embodiment, an MRI system is provided. The MRI system includes an imaging portion having an RF receiving coil, wherein the RF receiving coil includes a plurality of loops, each loop of the plurality of loops having a same perimeter

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
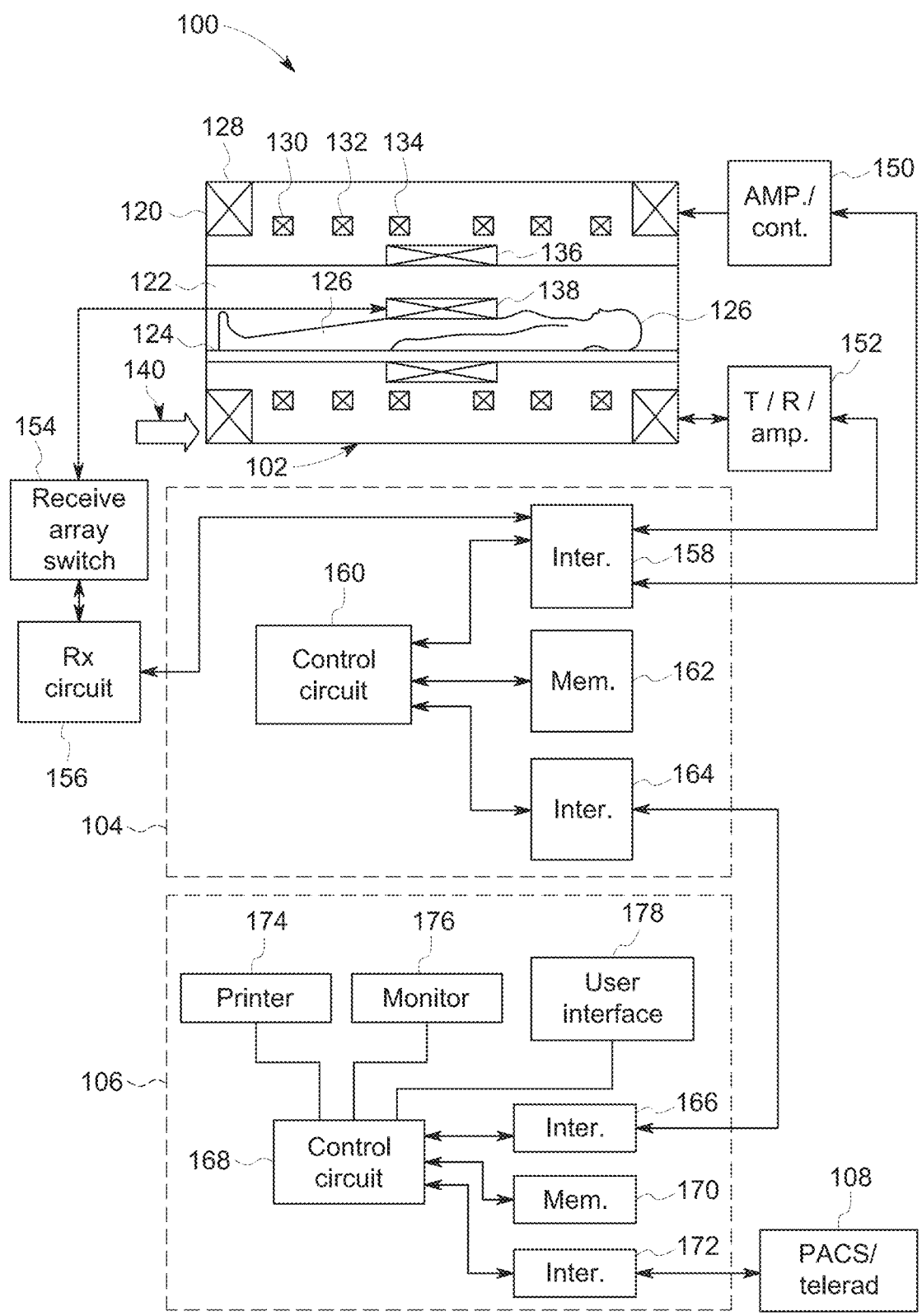
FIG. 1 illustrates an embodiment of a magnetic resonance imaging (MRI) system suitable for use with the disclosed technique.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present subject matter, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

While aspects of the following discussion are provided in the context of medical imaging, it should be appreciated that the disclosed techniques are not limited to such medical contexts. Indeed, the provision of examples and explanations in such a medical context is only to facilitate explanation by providing instances of real-world implementations and applications. However, the disclosed techniques may also be utilized in other contexts, such as image reconstruction for non-destructive inspection of manufactured parts or goods (i.e., quality control or quality review applications), and/or the non-invasive inspection of packages, boxes, luggage, and so forth (i.e., security or screening applications). In general, the disclosed techniques may be useful in any imaging or screening context or image processing or photography field where a set or type of acquired data undergoes a reconstruction process to generate an image or volume.

Older MRI systems are usually limited to a fewer number of channels since at low fields (less than 1 T) coil elements need to have a larger size. When retrofitting such a system within a RF receiving array, it is desirable to maximize the acceleration (e.g., of the array during parallel imaging) in all directions. The disclosed embodiments provide for an RF receiving array or array assembly that includes a topology that maximizes acceleration in all directions (e.g., up to R=3). An RF receiving array includes an RF coil having 8 elliptical loops having 3 different eccentricities, where each loop has the same perimeter. Each loop having the same perimeter simplifies loop management (e.g., manufacturing, tuning, service, etc.). In addition, the loops have a distributed capacitance construction. In particular, the RF coil is made of a coaxial conductor having a cross-section configured to generate exact capacitance for loop tuning at a specific frequency (e.g., 21.29 megahertz (MHz)). The loops include increased transparency and reliability and are light weight compared to typical RF coils. The RF receiving array assembly may include a 16-channel topology to provide the highest combined acceleration. For example, an anterior RF receiving array may include an RF coil having 8 loops having a same perimeter and a posterior RF receiving array may include an RF coil having 8 loops having a same perimeter. In certain embodiments, a topology of the anterior RF receiving array and a topology of the posterior RF receiving array may be the same. The RF receiving array assembly may be utilized with a low field MRI scanner (less than 1 T). In certain embodiments, the RF receiving array assembly may utilized with a 0.5 T MRI scanner.

With the preceding in mind, FIG. 1 a magnetic resonance imaging (MRI) system 100 is illustrated schematically as including a scanner 102, scanner control circuitry 104, and system control circuitry 106. According to the embodiments described herein, the MRI system 100 is generally configured to perform MR imaging.

System 100 additionally includes remote access and storage systems or devices such as picture archiving and communication systems (PACS) 108, or other devices such as teleradiology equipment so that data acquired by the system 100 may be accessed on- or off-site. In this way, MR data may be acquired, followed by on- or off-site processing and evaluation. While the MRI system 100 may include any suitable scanner or detector, in the illustrated embodiment, the system 100 includes a full body scanner 102 having a housing 120 through which a bore 122 is formed. A table 124 is moveable into the bore 122 to permit a patient 126 to be positioned therein for imaging selected anatomy within the patient.

Scanner 102 includes a series of associated coils for producing controlled magnetic fields for exciting the gyromagnetic material within the anatomy of the subject being imaged. Specifically, a primary magnet coil 128 is provided for generating a primary magnetic field, B0, which is generally aligned with the bore 122. A series of gradient coils 130, 132, and 134 permit controlled magnetic gradient fields to be generated for positional encoding of certain of the gyromagnetic nuclei within the patient 126 during examination sequences. A radio frequency (RF) coil 136

(e.g., RF transmit coil) is configured to generate radio frequency pulses for exciting the certain gyromagnetic nuclei within the patient. In addition to the coils that may be local to the scanner 102, the system 100 also includes a set of receiving coils or RF receiving coils 138 (e.g., an array of coils) configured for placement proximal (e.g., against) to the patient 126. As an example, the receiving coils 138 can include cervical/thoracic/lumbar (CTL) coils, head coils, single-sided spine coils, and so forth. Generally, the receiving coils 138 are placed close to or on top of the patient 126 so as to receive the weak RF signals (weak relative to the transmitted pulses generated by the scanner coils) that are generated by certain of the gyromagnetic nuclei within the patient 126 as they return to their relaxed state.

The various coils of system 100 are controlled by external circuitry to generate the desired field and pulses, and to read emissions from the gyromagnetic material in a controlled manner. In the illustrated embodiment, a main power supply 140 provides power to the primary field coil 128 to generate the primary magnetic field, Bo. A power input 44 (e.g., power from a utility or grid), a power distribution unit (PDU), a power supply (PS), and a driver circuit 150 may together provide power to pulse the gradient field coils 130, 132, and 134. The driver circuit 150 may include amplification and control circuitry for supplying current to the coils as defined by digitized pulse sequences output by the scanner control circuit 104.

Another control circuit 152 is provided for regulating operation of the RF coil 136. Circuit 152 includes a switching device for alternating between the active and inactive modes of operation, wherein the RF coil 136 transmits and does not transmit signals, respectively. Circuit 152 also includes amplification circuitry configured to generate the RF pulses. Similarly, the receiving coils 138 are connected to switch 154, which is capable of switching the receiving coils 138 between receiving and non-receiving modes. Thus, the receiving coils 138 resonate with the RF signals produced by relaxing gyromagnetic nuclei from within the patient 126 while in the receiving mode, and they do not resonate with RF energy from the transmitting coils (i.e., coil 136) so as to prevent undesirable operation while in the non-receiving mode. Additionally, a receiving circuit 156 is configured to receive the data detected by the receiving coils 138 and may include one or more multiplexing and/or amplification circuits.

It should be noted that while the scanner 102 and the control/amplification circuitry described above are illustrated as being coupled by a single line, many such lines may be present in an actual instantiation. For example, separate lines may be used for control, data communication, power transmission, and so on. Further, suitable hardware may be disposed along each type of line for the proper handling of the data and current/voltage. Indeed, various filters, digitizers, and processors may be disposed between the scanner and either or both of the scanner and system control circuitry 104, 106.

As illustrated, scanner control circuit 104 includes an interface circuit 158, which outputs signals for driving the gradient field coils and the RF coil and for receiving the data representative of the magnetic resonance signals produced in examination sequences. The interface circuit 158 is coupled to a control and analysis circuit 160. The control and analysis circuit 160 executes the commands for driving the circuit 150 and circuit 152 based on defined protocols selected via system control circuit 106.

Control and analysis circuit 160 also serves to receive the magnetic resonance signals and performs subsequent processing before transmitting the data to system control circuit 106. Scanner control circuit 104 also includes one or more memory circuits 162, which store configuration parameters, pulse sequence descriptions, examination results, and so forth, during operation.

Interface circuit 164 is coupled to the control and analysis circuit 160 for exchanging data between scanner control circuit 104 and system control circuit 106. In certain embodiments, the control and analysis circuit 160, while illustrated as a single unit, may include one or more hardware devices. The system control circuit 106 includes an interface circuit 166, which receives data from the scanner control circuit 104 and transmits data and commands back to the scanner control circuit 104. The control and analysis circuit 168 may include a CPU in a multi-purpose or application specific computer or workstation. Control and analysis circuit 168 is coupled to a memory circuit 170 to store programming code for operation of the MRI system 100 and to store the processed image data for later reconstruction, display and transmission. The programming code may execute one or more algorithms that, when executed by a processor, are configured to perform reconstruction of acquired data as described below. In certain embodiments, the memory circuit 170 may store one or more neural networks for reconstruction of acquired data as described below. In certain embodiments, image reconstruction may occur on a separate computing device having processing circuitry and memory circuitry.

An additional interface circuit 172 may be provided for exchanging image data, configuration parameters, and so forth with external system components such as remote access and storage devices 108. Finally, the system control and analysis circuit 168 may be communicatively coupled to various peripheral devices for facilitating operator interface and for producing hard copies of the reconstructed images. In the illustrated embodiment, these peripherals include a printer 174, a monitor 176, and user interface 178 including devices such as a keyboard, a mouse, a touchscreen (e.g., integrated with the monitor 176), and so forth.

Figure 2:
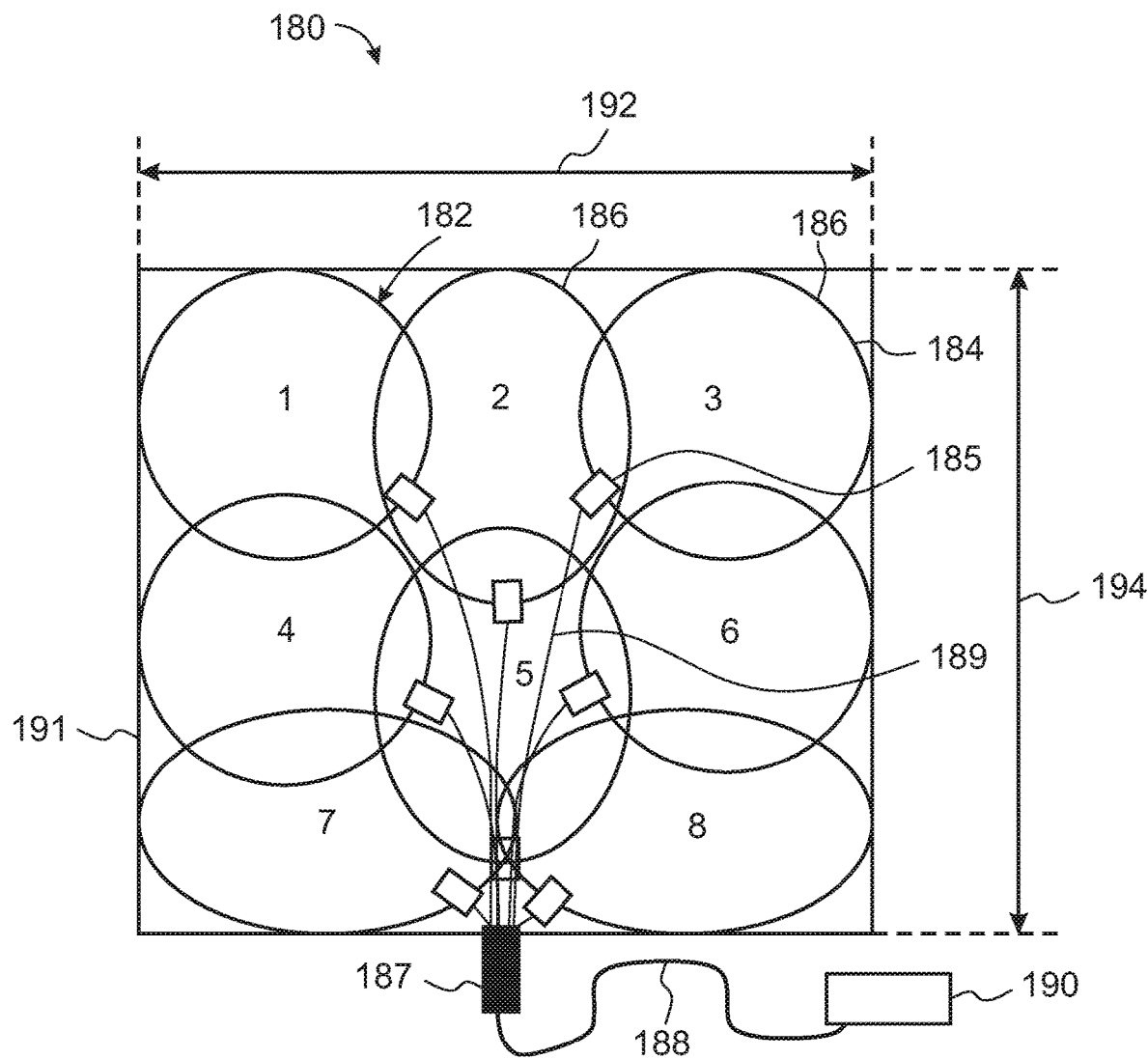
FIG. 2 is a schematic diagram of an RF coil array and its topology, in accordance with aspects of the present disclosure.

FIG. 2 is a schematic diagram of an RF coil array 180 (e.g., RF receiving coil array) and its topology. The RF coil array 180 may be utilized in an MII system (e.g., MM system 100 in FIG. 1). The RF coil array 180 includes an RF coil 182 having a plurality of loops 184 (e.g., elements or channels) with each loop 184 having a perimeter 186. In the topology depicted in FIG. 2, each loop 184 has a different perimeter 186. In certain embodiments, as discussed below, each loop 184 may have a same perimeter 186 (e.g., to simplify loop managements). The RF coil array 180 may serve as an anterior array or a posterior array during MII imaging. In certain embodiments, an RF coil array assembly may include both an anterior array and a posterior array (e.g., for whole body imaging) to provide 16 channels.

As depicted in FIG. 2, the plurality of loops 184 includes 8 loops (e.g., labeled 1-8). Each loop 184 is coupled to an electronics unit 185 coupled to a coil-interfacing cable 189. The coil-interfacing cables 189 of each of the loops 184 is coupled to a balun 187 (e.g., integrated balun cable harness). Each electronics unit 185 may include various components (e.g., a decoupling circuit, an impedance inverter circuit, and a pre-amplifier). The balun 187 may act as an RF trap. The balun 187 is coupled (via a cable 188) to a P connector 190 (e.g., port connector) that enables the RF coil array 180 to be coupled to the interface of the MM system that couples imaging components to processing components.

Figure 18:
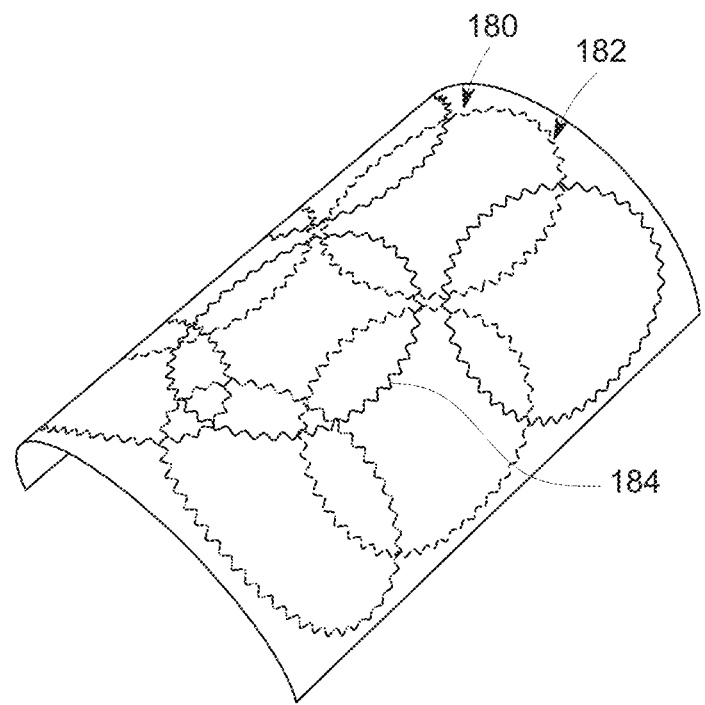
FIG. 18 illustrates a perspective view of an RF coil array having stretchable loops (e.g., in a relaxed state), in accordance with aspects of the present disclosure.
Figure 19:
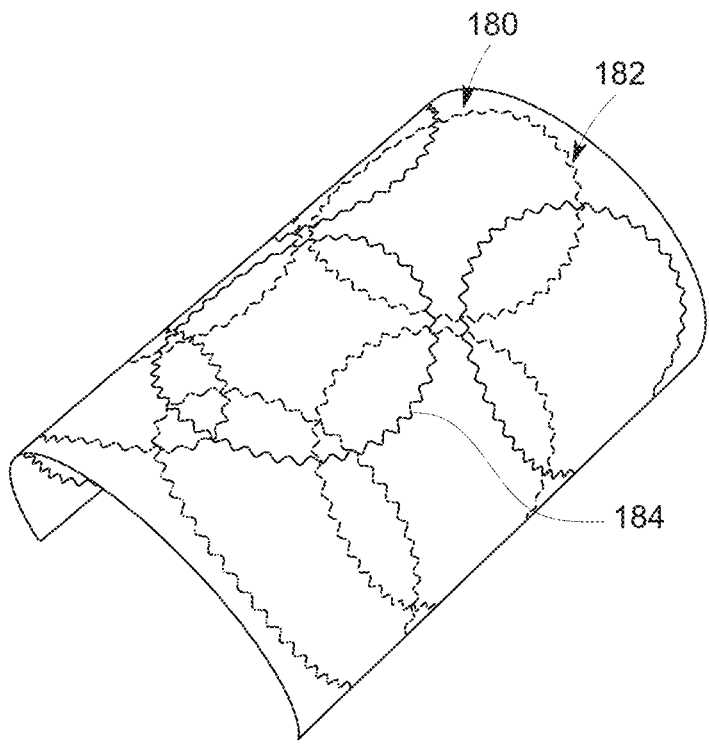
FIG. 19 illustrates a perspective view the RF coil array in FIG. 18 (e.g., in a stretched state)
Figure 20:
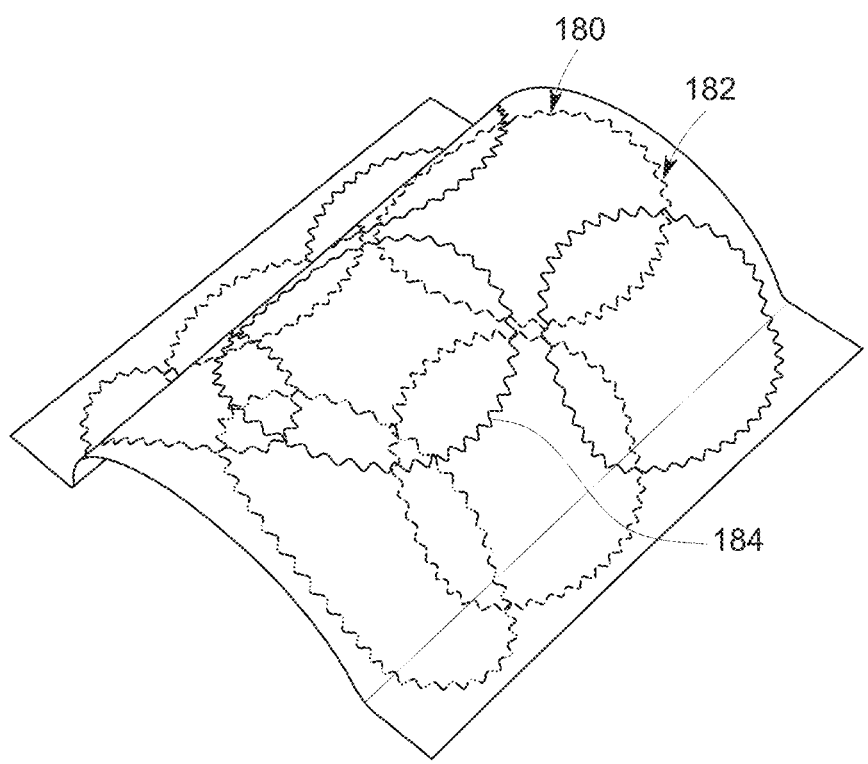
FIG. 20 illustrates a perspective view of the RF coil array in FIG. 18 (e.g., in a partially stretched state).

The loops 184 are disposed within a flexible enclosure 191 (e.g., blanket). The flexible enclosure 191 has a rectangular shape. In certain embodiments, the flexible enclosure 191 has a square shape. The RF coil array 180 may provide a target coverage of approximately 50 centimeters (cm) field of view. In the left-right direction, a length 192 of the enclosure 188 and coverage is approximately 55 cm. In certain embodiments, the length 192 and coverage in the left-right direction is approximately 50 cm. In the superior-inferior direction a length 194 and coverage is approximately 50 cm. In certain embodiments, the loops 184 do not stretch but the enclosure 191 includes a respective hole located radially within each loop 184 to enable the enclosure 191 to be stretched about the subject to be imaged. In certain embodiments, the loops 184 cannot be stretched. In certain embodiments, the loops 184 may stretch (e.g., due to a liquid metal conductor or a meandering trace) as shown in FIGS. 18-20.

The loops 184 have three different eccentricities. For example, loops 1, 3, 4, and 6 (e.g., having a more circular shape) have the same eccentricity and associated dimensions. Loops 2 and 5 have the same eccentricity (e.g., being slightly more elongated than loops 1, 3, 4, and 6) and associated dimensions. Loops 7 and 8 have the same eccentricity (e.g., having a more elongated elliptical shape) and associated dimensions. Loops 1, 3, 4, and 6 are more elongated along the length 192. Loops 2 and 5 are more elongated along the length 194. Loops 7 and 8 are more elongated along the length 192. As depicted in FIG. 2, loops 2 and 5 are disposed between loops 1, 3, 4, and 6, while loops 7 and 8 are located on a bottom portion (i.e., portion located closer to feet of an imaged subject) of the RF coil array 180.

As depicted in FIG. 2, each loop 184 partially overlaps with at least two adjacent loops 184. For example, loops 1 and 3 each partially overlap with two adjacent loops 184. Loops 4, 6, 7, and 8 each partially overlap with three adjacent loops 184. Loop 5 partially overlaps with five adjacent loops 184.

Figure 3:
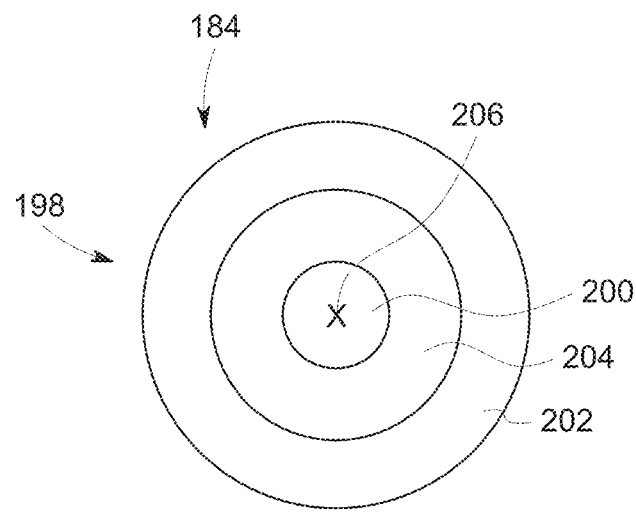
FIG. 3 is a cross-section of an RF coil, in accordance with aspects of the present disclosure.

Each loop 184 includes a distributed capacitance construction. In particular, each loop 184 includes a coaxial conductor having a cross-section configured to generate exact capacitance for loop tuning at a specific frequency (e.g., 21.29 MHz). For example, as depicted in FIG. 3, a coaxial coil loop portion 198 (of a loop 184) includes a round center conductor wire 200, an outer concentric shield 202, and a dielectric material 204 in between. The center conductor wire 200 may be of copper (e.g., silver plated copper) and the dielectric material 204 may be rubber, plastic, or some other dielectric material (e.g., fluoroethylenepropylene (FEP) or polytetrafluoroethylene (pTFE)). The outer concentric shield 202 may encase or otherwise surround the dielectric material 204 and center conductor wire 200 and may be comprised of braided copper or other suitable conductive material. The center conductor 200, dielectric material 204, and outer shield 202 all share a common central axis 206. Further, while not shown in FIG. 3, in some examples, an outer jacket (e.g., made of dielectric material) may surround the outer shield 202. While two coaxial conductors (center conductor wire 200 and outer shield 204) are shown in FIG. 3, an RF coil loop portion may include three or more coaxial conductors, encapsulated and separated from each other by dielectric material. In certain embodiments, the center conductor wire 200 may be made of a liquid metal conductor to enable the loop 184 to be stretched. Alternatively, each loop 184 may include litz wire, a regular stranded wire, or a spiral wire woven on an extendible non-conductive support or a meandering trace (e.g., such as in FIGS. 18-20).

Returning to FIG. 2, the RF coil 182 may be designed utilizing AIR™ coil technology from General Electric Healthcare. This enables the RF coil 182 to be lightweight and flexible. For example, each RF coil 182 (e.g., for an anterior array or a posterior array) may be 800 grams or less. The weight of each RF coil 182 with all of the attached cables may be 2.5 kilograms or less. In addition, the loops 184 of the RF coil 182 are transparent, thus, aiding signal-to-noise ratios.

Figure 4:
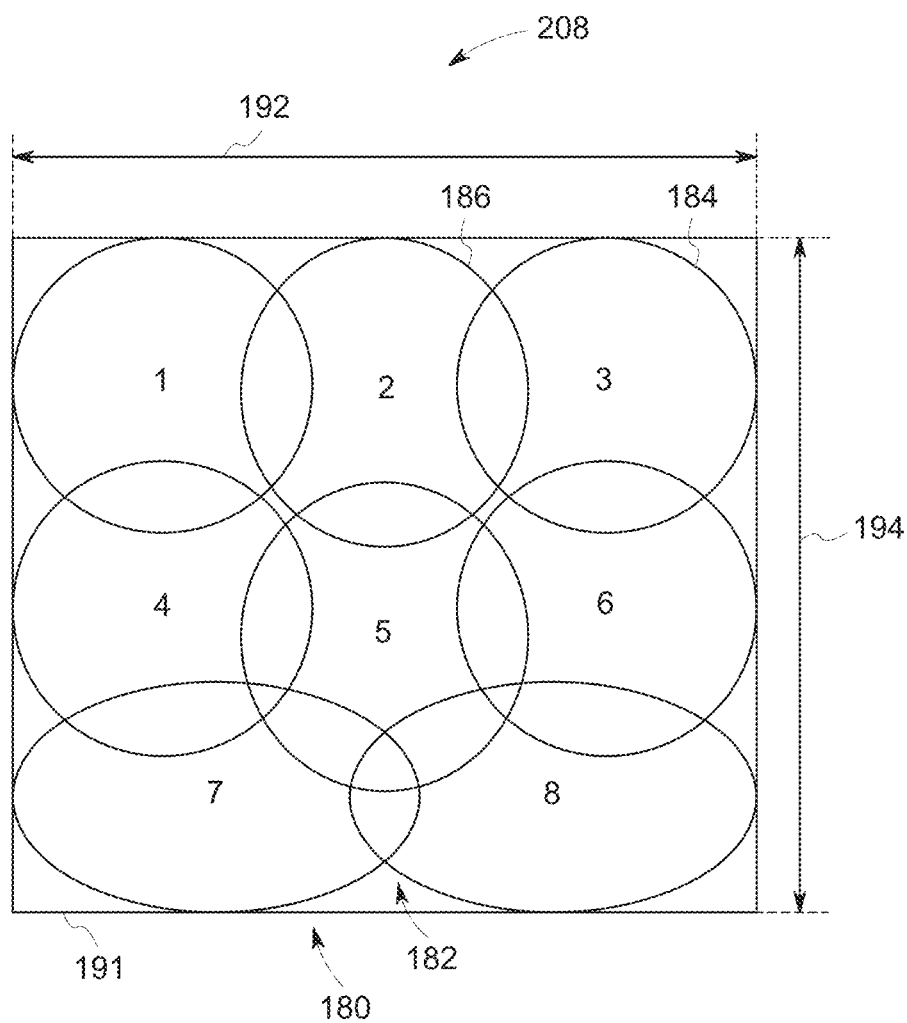
FIG. 4 is schematic diagram of a topology of an RF coil within an RF coil array, in accordance with aspects of the present disclosure.

FIG. 4 depicts an alternative topology for the RF coil 182 of the RF coil array 180. As depicted, loops 1, 3, 4, and 6 (e.g., having a more circular shape) have the same eccentricity and associated dimensions. Loops 2 and 5 have the same eccentricity (e.g., being slightly more elongated than loops 1, 3, 4, and 6) and associated dimensions. Loops 7 and 8 have the same eccentricity (e.g., having a more elongated elliptical shape) and associated dimensions. Loops 1, 3, 4, and 6 are more elongated along the length 192. Loops 2 and 5 are more elongated along the length 194. Loops 7 and 8 are more elongated along the length 192. As depicted in FIG. 4, loops 2 and 5 are disposed between loops 1, 3, 4, and 6, while loops 7 and 8 are located on a bottom portion (i.e., portion located closer to feet of imaged subject) of the RF coil array 180. The topology of the RF coil 182 in FIG. 4 is similar to the topology in FIG. 2 except loops 2 and 5 are more circular and less elongated along the length 194 in FIG. 4. The lengths 192, 194 are approximately 55 cm and 50 cm, respectively.

As depicted in FIG. 4, each loop 184 partially overlaps with at least two adjacent loops 184. For example, loops 1 and 3 each partially overlap with two adjacent loops 184. Loops 4, 6, 7, and 8 each partially overlap with three adjacent loops 184. Loop 5 partially overlaps with five adjacent loops 184.

Figure 5:
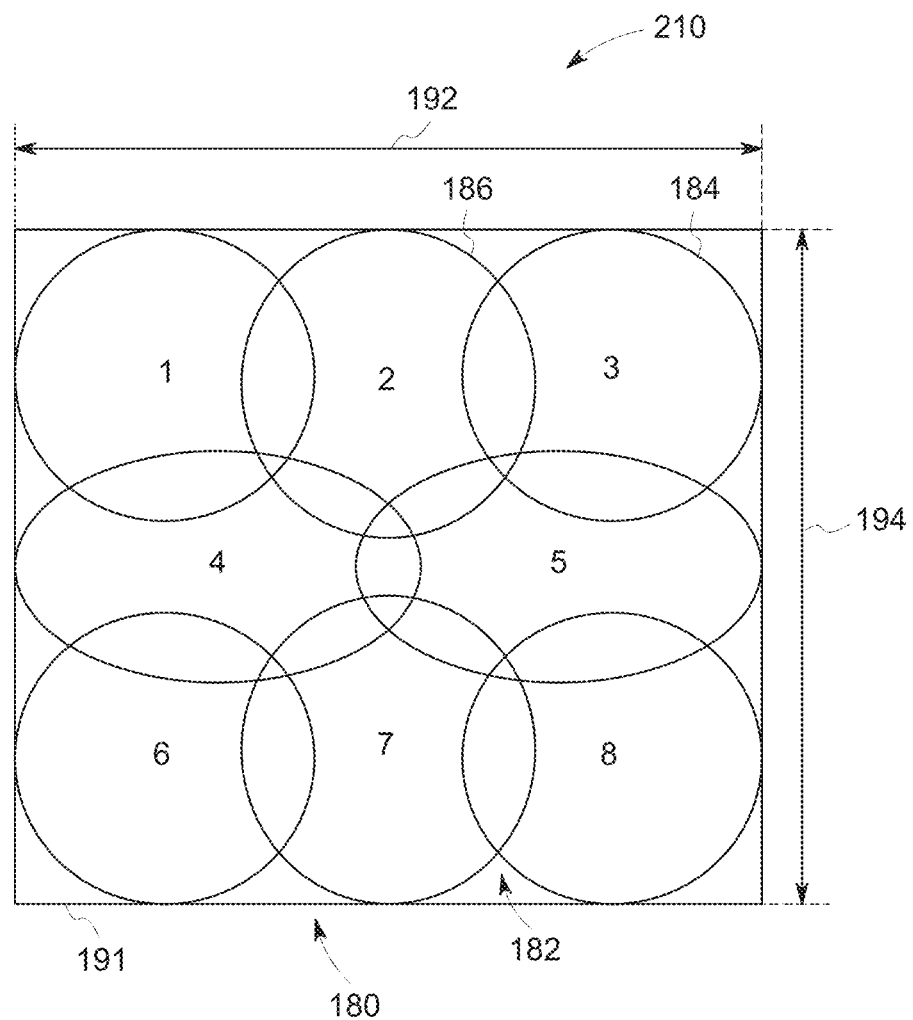
FIG. 5 is schematic diagram of another topology of an RF coil within an RF coil array, in accordance with aspects of the present disclosure.

FIG. 5 depicts another topology for the RF coil 182 of the RF coil array 180. As depicted, loops 1, 3, 6, and 8 (e.g., having a more circular shape) have the same eccentricity and associated dimensions. Loops 2 and 7 have the same eccentricity (e.g., being slightly more elongated than loops 1, 3, 6, and 8) and associated dimensions. Loops 4 and 5 have the same eccentricity (e.g., having a more elongated elliptical shape) and associated dimensions. Loops 2 and 7 are more elongated along the length 194 than loops 1, 3, 6, and 8. Loops 4 and 5 are more elongated along the length 192 than loops 1, 2, 3, 6, 7, and 8. As depicted in FIG. 5, loops 1, 3, 6, and 8 are disposed in the corners of the RF coil array 180. Loops 4 and 5 are centrally located between the loops 1, 2, and 3 (which are near the upper portion of the RF coil array 180) and loops 6, 7, and 8 (which are near the bottom portion of the RF coil array 180). Loop 2 is located between loops 1 and 3, while loop 7 is located between the loops 6 and 8. The lengths 192, 194 are approximately 55 cm and 50 cm, respectively.

As depicted in FIG. 5, each loop 184 partially overlaps with at least two adjacent loops 184. For example, loops 1, 3, 6, and 8 each partially overlap with two adjacent loops 184. Loops 2 and 7 each partially overlap with four adjacent loops 184. Loops 4 and 5 each partially overlap with five adjacent loops 184.

Figure 6:
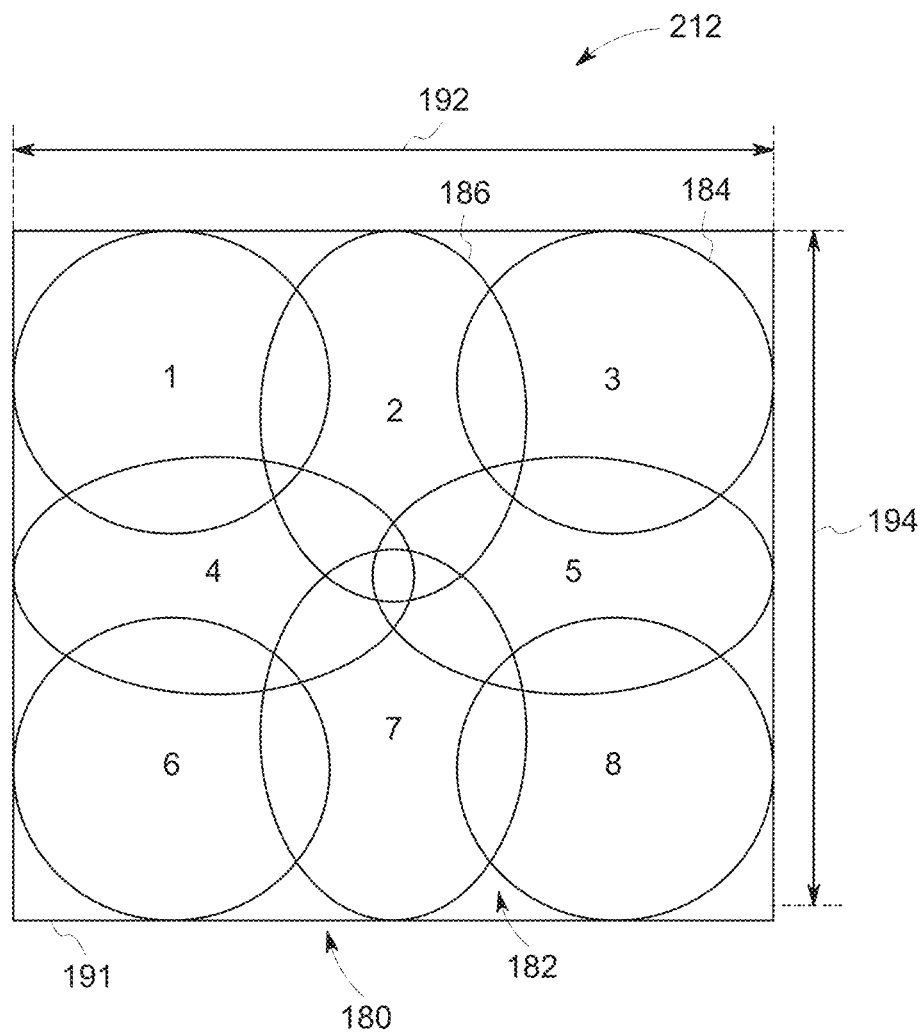
FIG. 6 is schematic diagram of a further topology of an RF coil within an RF coil array, in accordance with aspects of the present disclosure.

FIG. 6 depicts another topology for the RF coil 182 of the RF coil array 180. As depicted, loops 1, 3, 6, and 8 (e.g., having a more circular shape) have the same eccentricity and associated dimensions. Loops 2 and 7 have the same eccentricity (e.g., having a more elongated elliptical shape) and associated dimensions. Loops 4 and 5 have the same eccentricity (e.g., also having a more elongated elliptical shape) and associated dimensions. Loops 2 and 7 are more elongated along the length 194 than loops 1, 3, 4, 5, 6, and 8. Loops 4 and 5 are more elongated along the length 192 than loops 1, 2, 3, 6, 7, and 8. As depicted in FIG. 6, loops 1, 3, 6, and 8 are disposed in the corners of the RF coil array 180. Loops 4 and 5 are centrally located between the loops 1, 2, and 3 (which are near the upper portion of the RF coil array 180) and loops 6, 7, and 8 (which are near the bottom portion of the RF coil array 180). Loop 2 is located between loops 1 and 3, while loop 7 is located between the loops 6 and 8. The lengths 192, 194 are approximately 55 cm and 50 cm, respectively.

As depicted in FIG. 6, each loop 184 partially overlaps with at least two adjacent loops 184. For example, loops 1, 3, 6, and 8 each partially overlap with two adjacent loops 184. Loops 2, 4, 5, and 7 each partially overlap with five adjacent loops 184.

Figure 7:
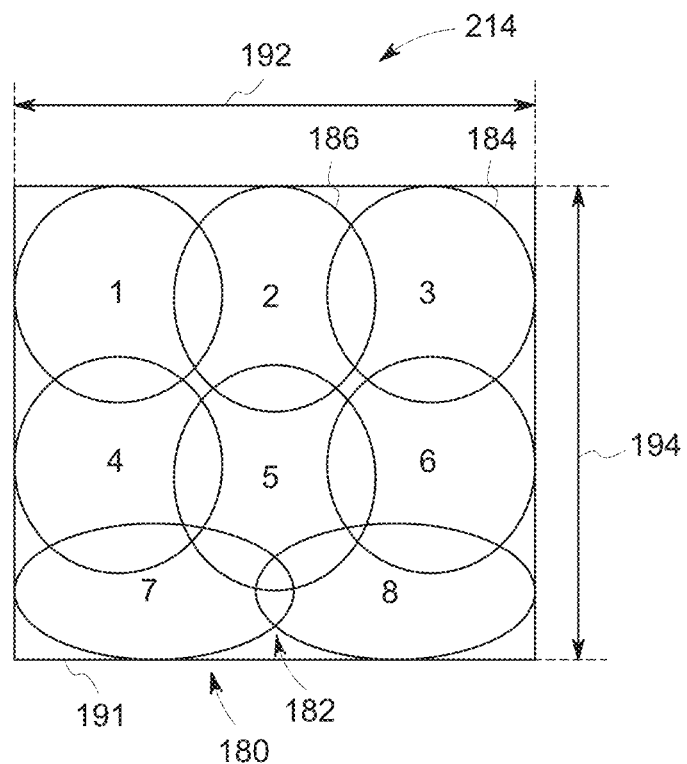
FIG. 7 is a schematic diagram of a topology for an RF coil within an RF coil array (e.g., having equal perimeter loops), in accordance with aspects of the present disclosure.

FIGS. 7-10 depict RF coils 182 with loops 184 having equal perimeters 186. Each loop 184 having a same perimeter 186 simplifies loop management (e.g., manufacturing, tuning, service, etc.). FIG. 7 depicts a topology for the RF coil 182 of the RF coil array 180 where the loops have equal perimeters 186. As depicted, loops 1, 3, 4, and 6 (e.g., having a more circular shape) have the same eccentricity and associated dimensions. Loops 2 and 7 have the same eccentricity (e.g., having a more elongated elliptical shape than loops 1, 3, 4, and 6) and associated dimensions. Loops 7 and 8 have the same eccentricity (e.g., also having a more elongated elliptical shape) and associated dimensions. Loops 2 and 5 are more elongated along the length 194 than loops 1, 3, 4, 6, 7, and 8. Loops 7 and 8 are more elongated along the length 192 than loops 1-6. As depicted in FIG. 7, loops 1 and 3 are disposed in the upper corners of the RF coil array 180 with loops 4 and 6 right below. Loop 2 is centrally located between loops 1 and 3 while loop 6 is centrally located between loops 4 and 6. Loops 7 and 8 are disposed in the lower corners of the RF coil array 180. The lengths 192, 194 are approximately 55 cm and 50 cm, respectively.

As depicted in FIG. 7, each loop 184 partially overlaps with at least two adjacent loops 184. For example, loops 1 and 3 each partially overlap with two adjacent loops 184. Loops 2, 4, 6, 7, and 8 each partially overlap with three adjacent loops 184. Loop 5 partially overlaps with five adjacent loops 184.

Figure 8:
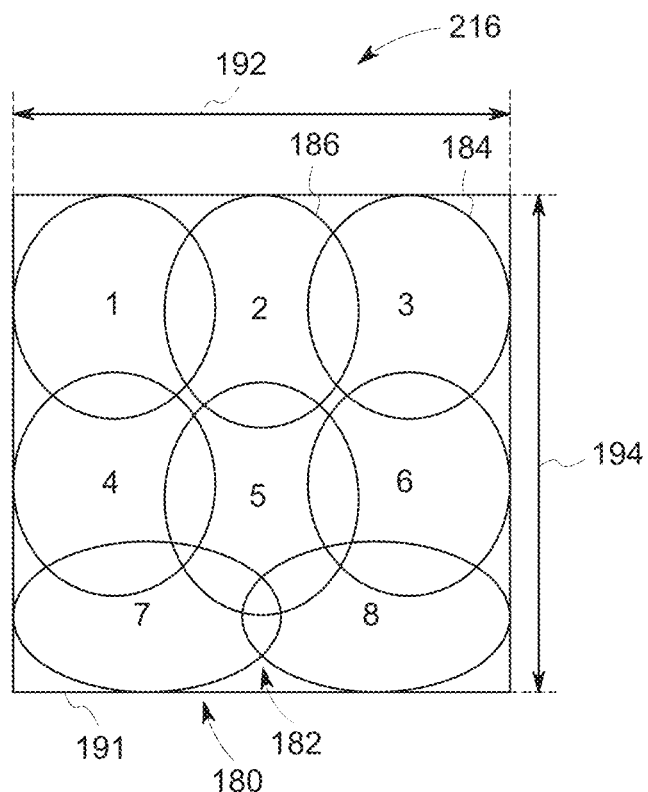
FIG. 8 is a schematic diagram of another topology for an RF coil within an RF coil array (e.g., having equal perimeter loops), in accordance with aspects of the present disclosure.

FIG. 8 depicts another topology for the RF coil 182 of the RF coil array 180 where the loops have equal perimeters 186. As depicted, loops 1, 3, 4, and 6 (e.g., having a more circular shape) have the same eccentricity and associated dimensions. Loops 2 and 7 have the same eccentricity (e.g., having a more elongated elliptical shape than loops 1, 3, 4, and 6) and associated dimensions. Loops 7 and 8 have the same eccentricity (e.g., also having a more elongated elliptical shape) and associated dimensions. Loops 2 and 5 are more elongated along the length 194 than loops 1, 3, 4, 6, 7, and 8. Loops 7 and 8 are more elongated along the length 192 than loops 1-6. As depicted in FIG. 8, loops 1 and 3 are disposed in the upper corners of the RF coil array 180 with loops 4 and 6 right below. Loop 2 is centrally located between loops 1 and 3 while loop 6 is centrally located between loops 4 and 6. Loops 7 and 8 are disposed in the lower corners of the RF coil array 180. The lengths 192, 194 are approximately 50 cm and 50 cm (i.e., the same), respectively. The length 192 of RF coil array 180 is greater in FIG. 7 than FIG. 8.

As depicted in FIG. 8, each loop 184 partially overlaps with at least two adjacent loops 184. For example, loops 1 and 3 each partially overlap with two adjacent loops 184. Loops 2, 4, 6, 7, and 8 each partially overlap with three adjacent loops 184. Loop 5 partially overlaps with five adjacent loops 184.

Figure 9:
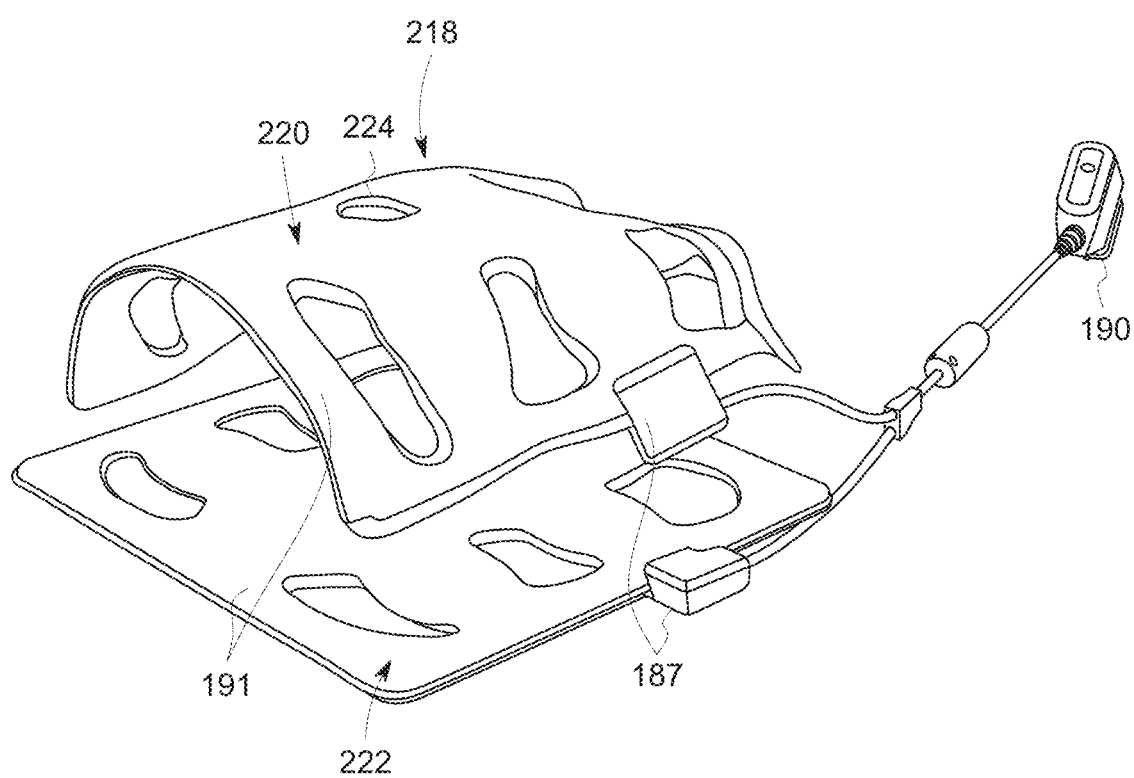
FIG. 9 is a perspective view of an RF coil array assembly having an anterior array and a posterior array, in accordance with aspects of the present disclosure.

FIG. 9 is a perspective view of an RF coil array assembly 218 having an anterior array 220 and a posterior array 222 configured to be disposed about a subject for MRI. Each array 220, 222 includes an RF coil having 8 loops with 3 different eccentricities as discussed above. Thus, the RF coil array assembly 218 has 16 channels (e.g., 8 channels for each array 220, 222). In addition, in certain embodiments, each loop of the 8 loops has the same perimeter. In certain embodiments, the respective RF coils within the arrays 220, 222 have the same topology as in FIG. 9. In certain embodiments, the respective RF coils within the arrays 220, 222 have different topologies.

As depicted in FIG. 9, the RF coils for each array 220, 222 are enclosed within a respective flexible enclosure 191. Each flexible enclosure 191 includes holes or openings 224. Each hole or opening 224 may be radially located within a loop. The openings 224 increases the flexibility of the arrays 220, 222. In certain embodiments, the flexible enclosure 191 may include deformable material within. The deformable material may include foam, memory foam, expanded foam, polyurethane foam, gels such as hydrogel, cells of water, or other suitable deformable material. When the subject lies on the array (e.g., array 222), the subject will sink into the deformable material and the RF coil may conform to the subject's unique shape and, thus, be right up against the patient's body.

As depicted in FIG. 9, each array 220, 222 has a balun 187 coupled to the respective loops of the RF coil. The baluns 187 of the arrays 220, 222 are coupled to a common P connector 190 that enables the arrays 220, 222 to be coupled to the interface of the MRI system that couples imaging components to processing components.

Figure 10:
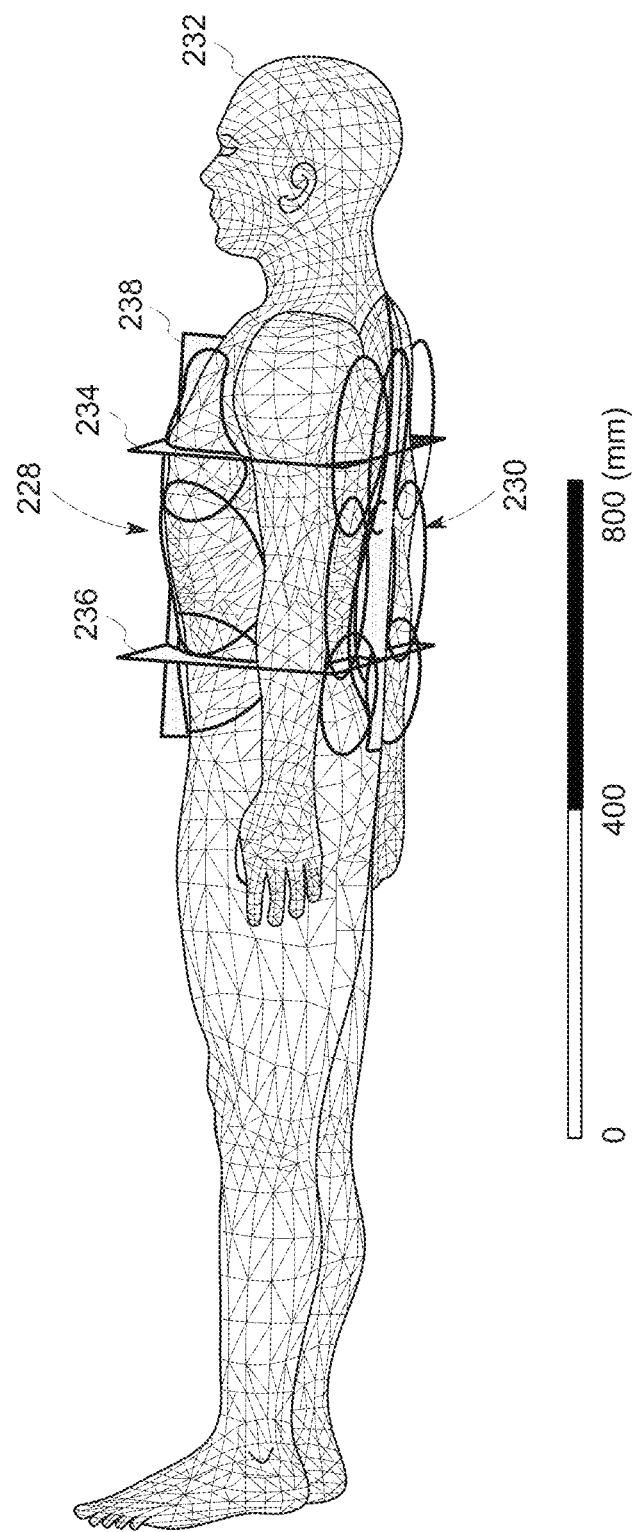
FIG. 10 illustrates an arrangement of an RF coil array assembly on a subject and associated planes utilized during analysis, in accordance with aspects of the present disclosure.

FIG. 10 depicts the arrangement of a 16-channel RF coil array 226 (e.g., having an 8-channel anterior array 228 and an 8-channel posterior array 230) on a subject 232 and the planes utilized during simulations utilizing three-dimensional (3D) electromagnetic software. As depicted in FIG. 10, the anterior array 228 is disposed on top of the subject 232 and the posterior array 230 is disposed underneath the subject 232. The planes include an axial plane 234, an axial plane 236, and a sagittal plane 238.

Figure 11:
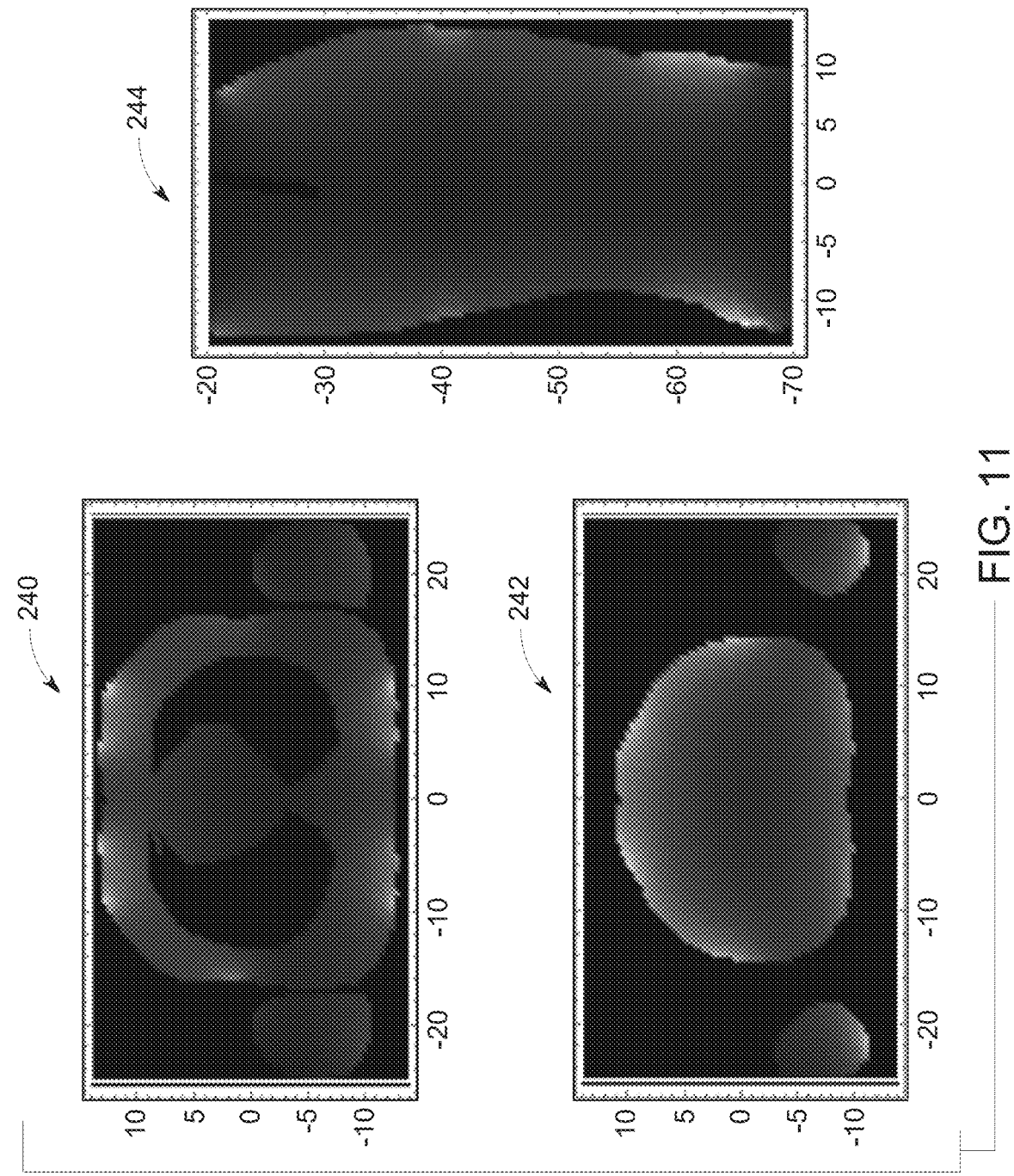
FIG. 11 illustrates various sensitivity maps utilizing the coil array assembly in FIG. 10, in accordance with aspects of the present disclosure.

FIG. 11 depicts sensitivity maps utilizing the RF coil array 226 in FIG. 10 during simulation with the 3D electromagnetic software. Sensitivity map 240 is along the axial plane 234. Sensitivity map 242 is along the axial plane 236. Sensitivity map 244 is along the sagittal plane 238.

Figure 12:
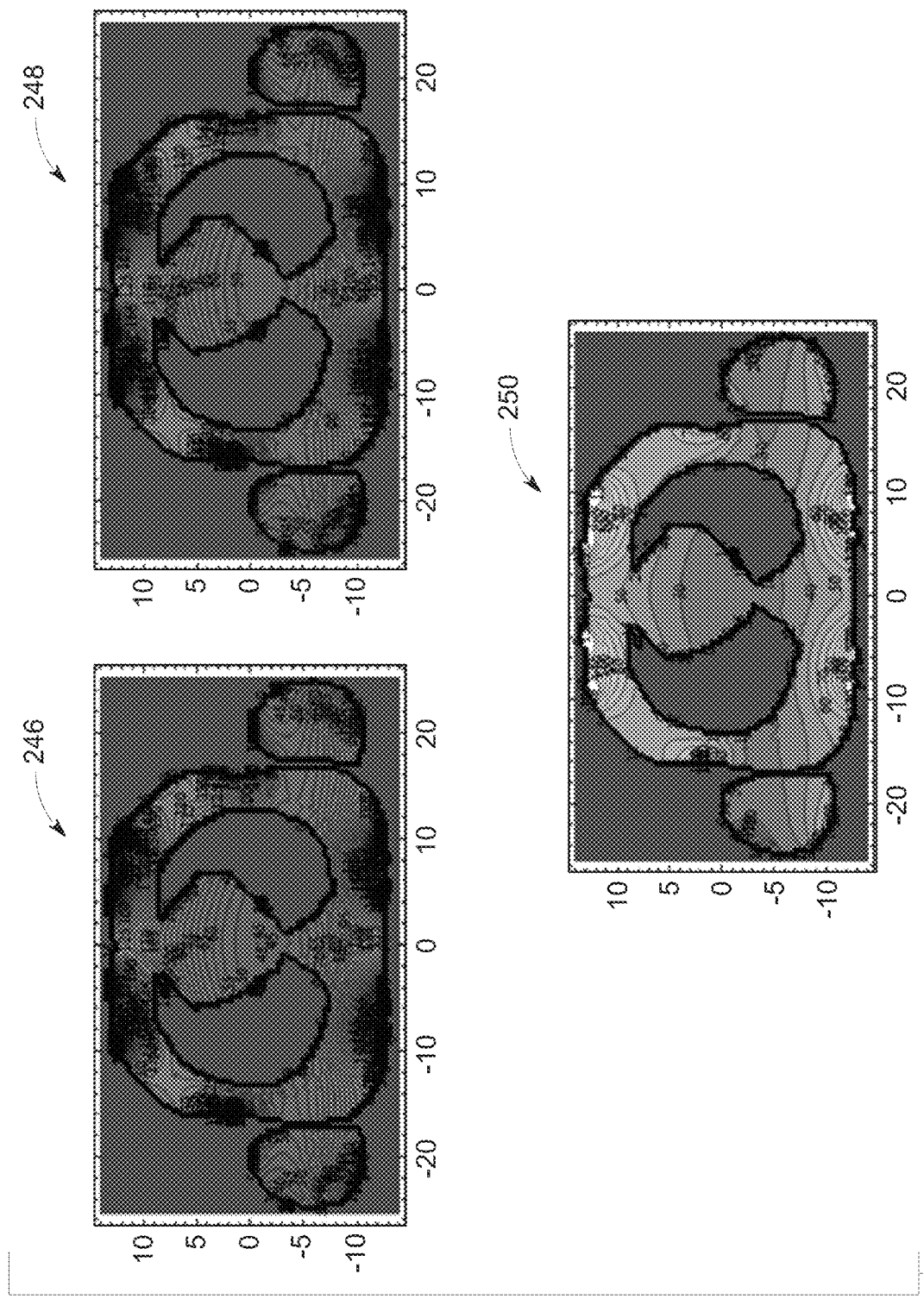
FIG. 12 illustrates signal-to-noise ratio (SNR) for reconstructed images utilizing the coil array assembly in FIG. 10 (e.g., for a first axial plane), in accordance with aspects of the present disclosure.
Figure 13:
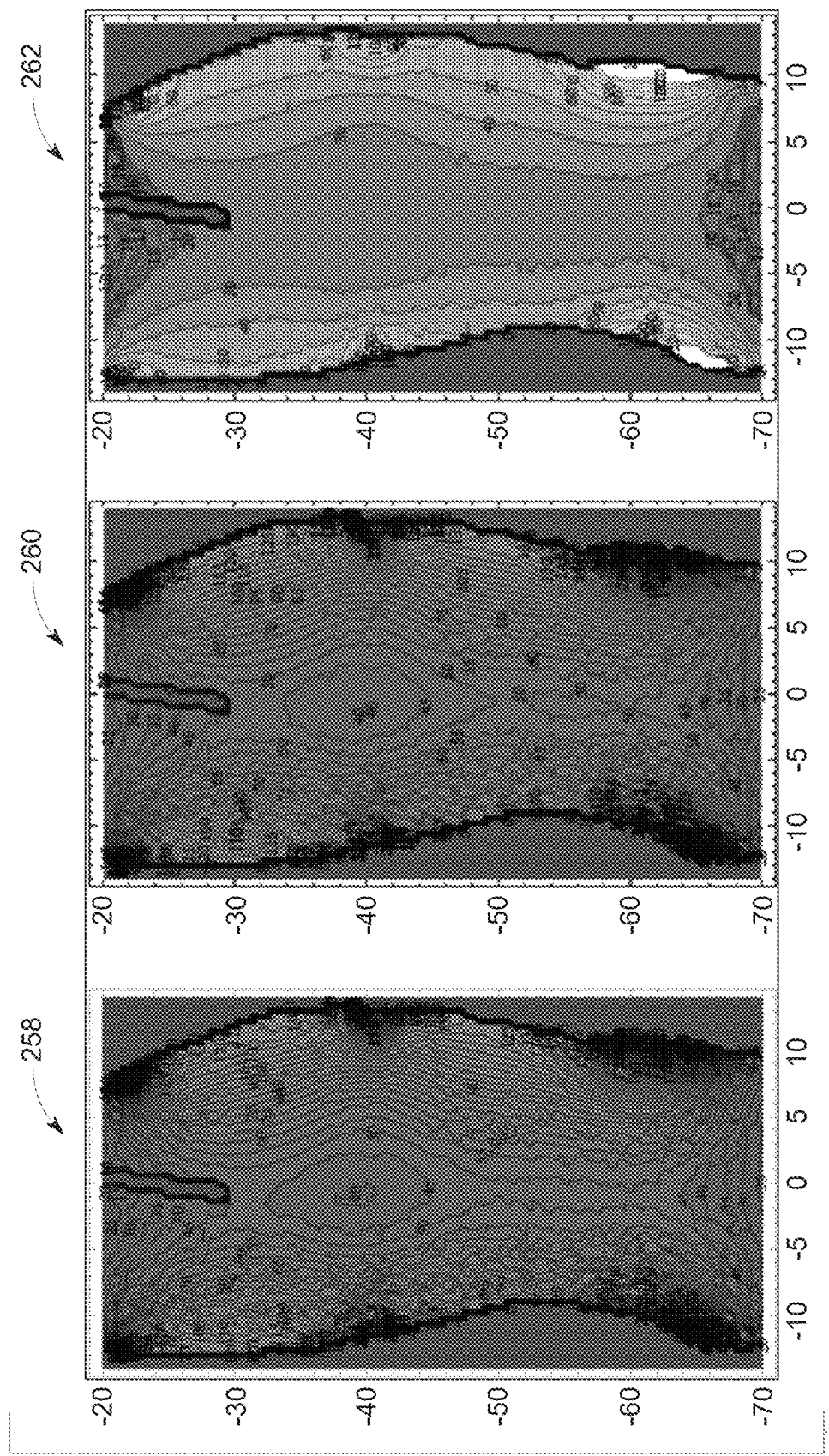
FIG. 13 illustrates signal-to-noise ratio (SNR) for reconstructed images utilizing the coil array assembly in FIG. 10 (e.g., for a sagittal plane), in accordance with aspects of the present disclosure.

FIG. 12 illustrates signal-to-noise ratio (SNR) for reconstructed images utilizing the coil array assembly 226 in FIG. 10 (e.g., along axial plane 234). SNR map 246 is for an image reconstructed utilizing a proprietary reconstruction algorithm. SNR map 248 is for an image reconstructed utilizing an optimal reconstruction algorithm (e.g., weighted sum of squares). Uniformity map 250 illustrates the differences in SNR between the two different reconstruction techniques. In either case, the SNR utilizing the coil array assembly is relatively high (i.e., compared to typical coil array assemblies utilized in low filed MRI scanners).

Figure 14:
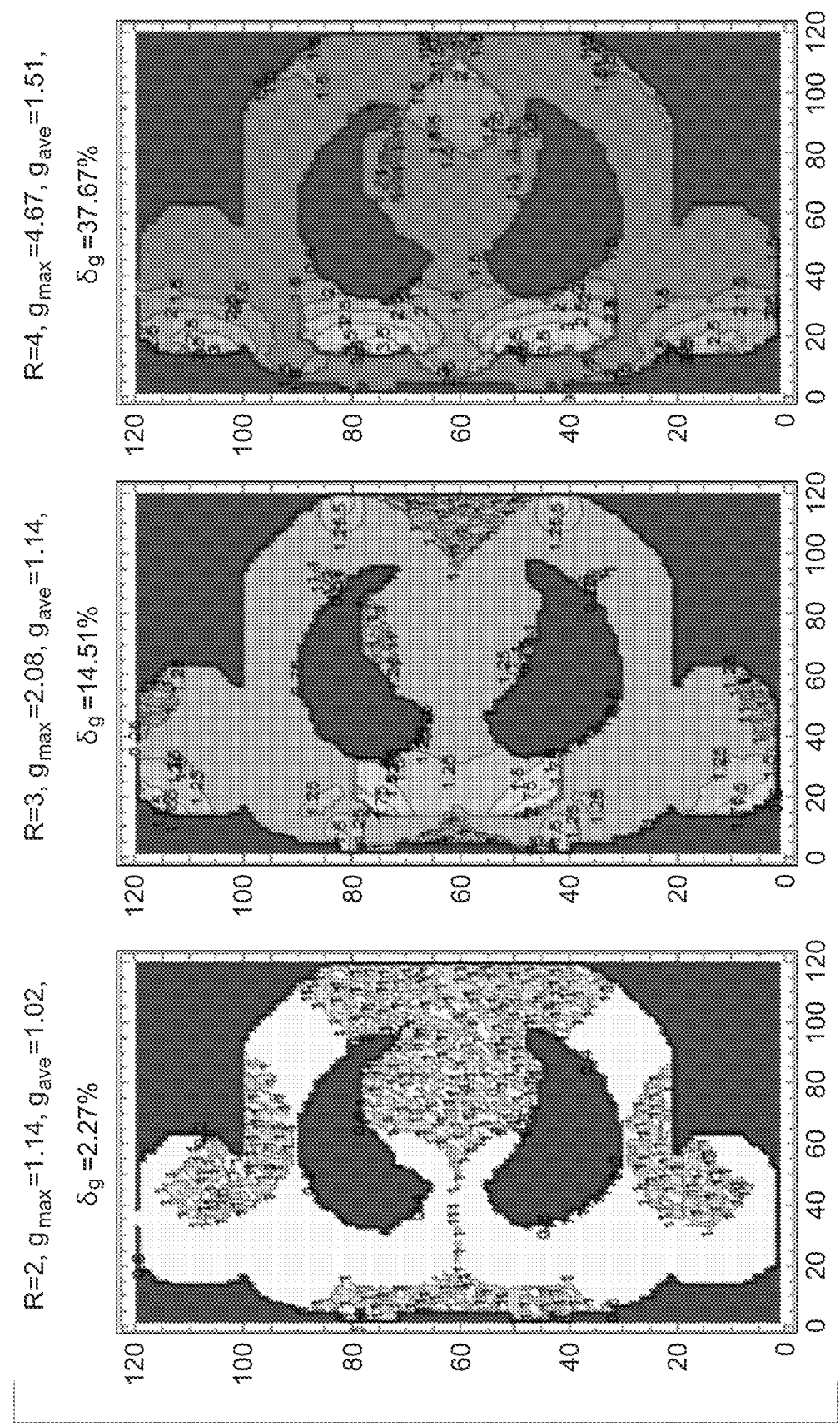
FIG. 14 illustrates a geometry factor for reconstructed images utilizing the coil array assembly in FIG. 10 (e.g., for a first axial plane in a left to right direction) at multiple acceleration factors, in accordance with aspects of the present disclosure.

FIG. 14 illustrates signal-to-noise ratio (SNR) for reconstructed images utilizing the coil array assembly 226 in FIG. 10 (e.g., along sagittal plane 238). SNR map 258 is for an image reconstructed utilizing a proprietary reconstruction algorithm. SNR map 260 is for an image reconstructed utilizing an optimal reconstruction algorithm (e.g., weighted sum of squares). Uniformity map 262 illustrates the differences in SNR between the two different reconstruction techniques. In either case, the SNR utilizing the coil array assembly is relatively high (i.e., compared to typical coil array assemblies utilized in low filed MRI scanners).

Figure 15:
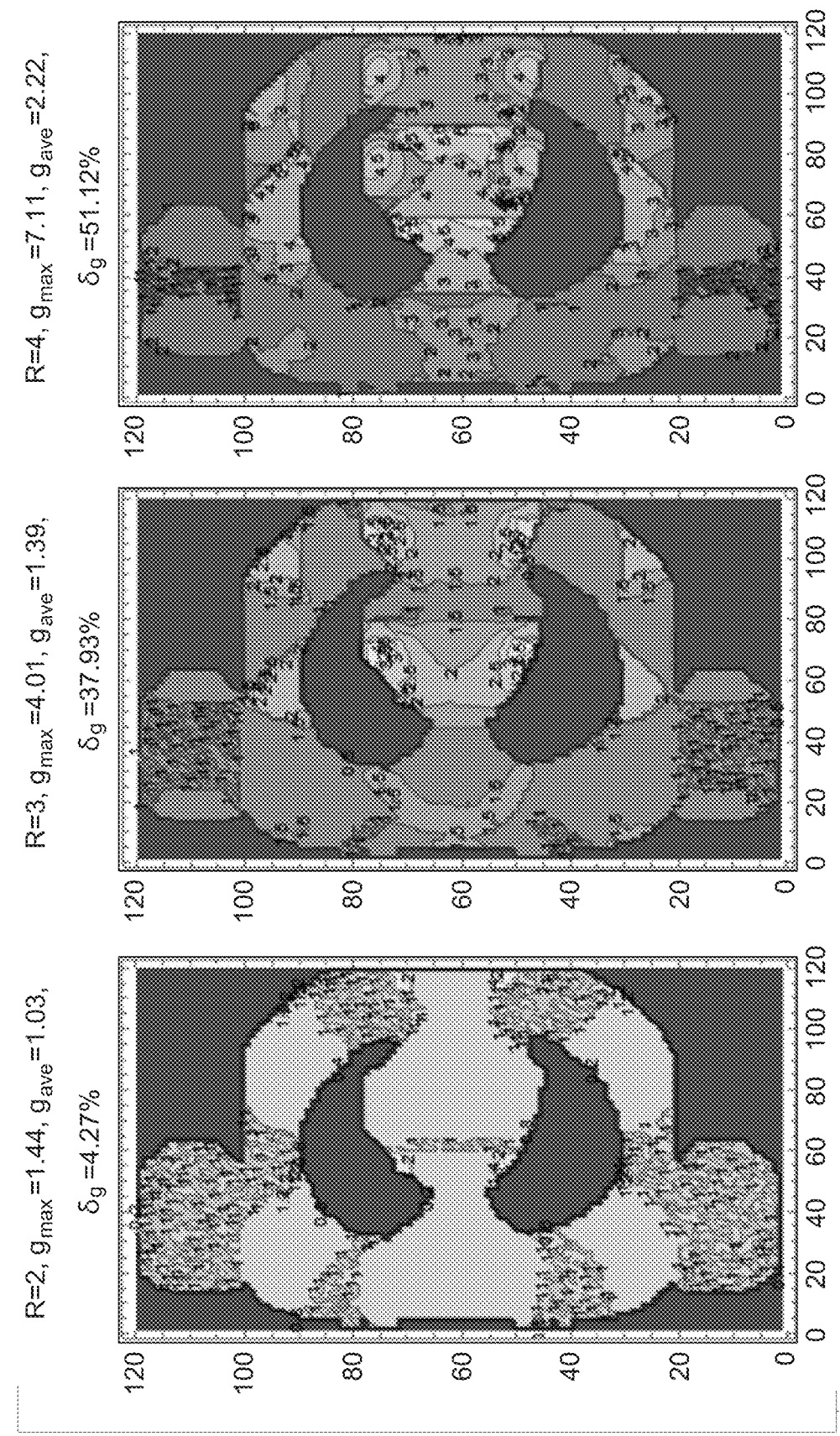
FIG. 15 illustrates a geometry factor for reconstructed images utilizing the coil array assembly in FIG. 10 (e.g., for a first axial plane in an anterior to posterior direction) at multiple acceleration factors, in accordance with aspects of the present disclosure.
Figure 16:
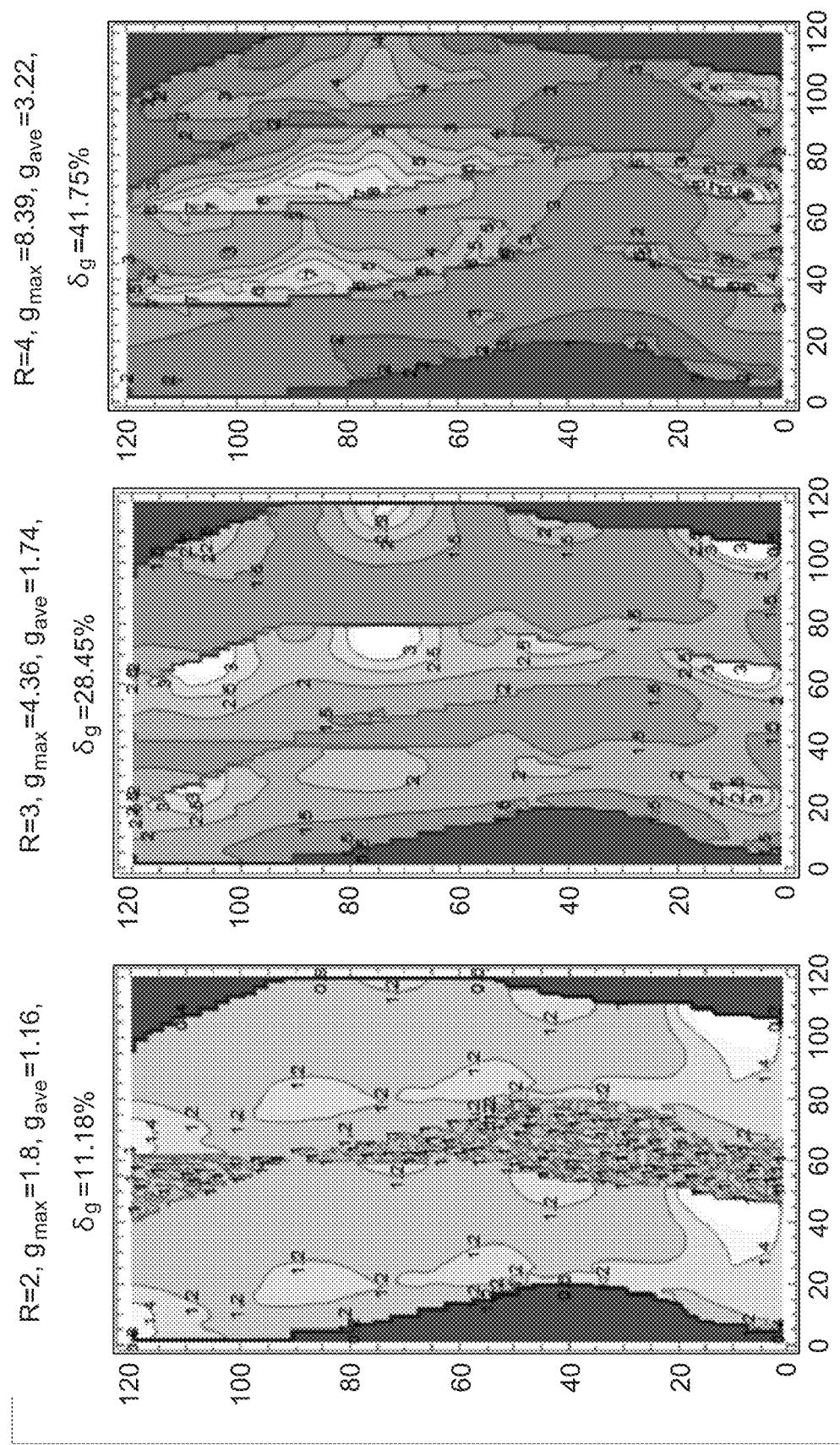
FIG. 16 illustrates a geometry factor for reconstructed images utilizing the coil array assembly in FIG. 10 (e.g., for a sagittal plane in an anterior to posterior direction) at multiple acceleration factors, in accordance with aspects of the present disclosure.
Figure 17:
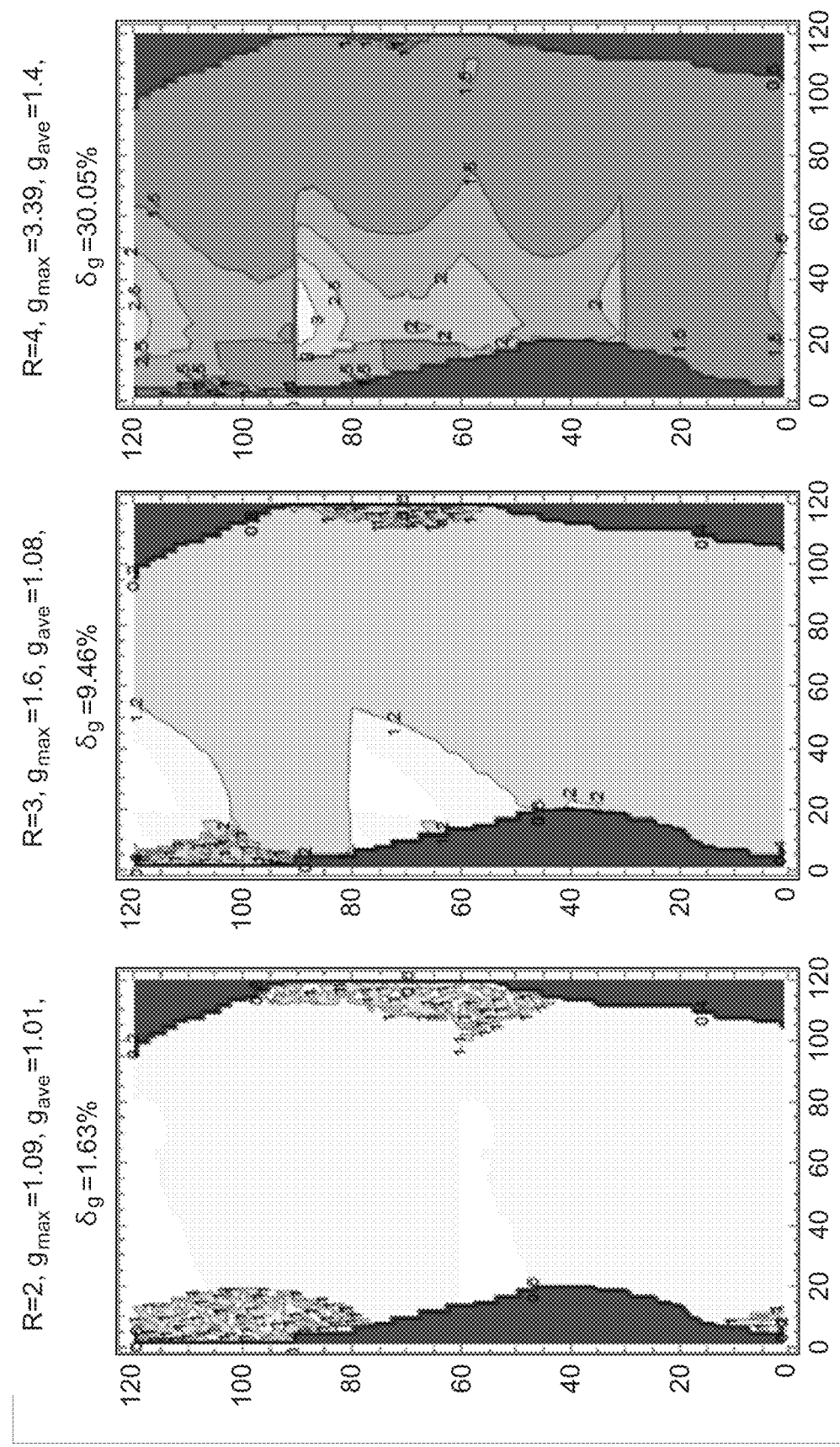
FIG. 17 illustrates a geometry factor for reconstructed images utilizing the coil array assembly in FIG. 10 (e.g., for a sagittal plane in a superior to inferior direction) at multiple acceleration factors, in accordance with aspects of the present disclosure.

As noted above, the topology of the loops of the RF coils maximize the acceleration (e.g., of the array during parallel imaging) in all directions. FIGS. 14-17 illustrate the geometry factor (g or G-factor) for reconstructed images utilizing the coil array assembly 226 in FIG. 10 from an acceleration factor R=2 to R=4 for different phase-encoding directions along the planes noted in FIG. 10. A G-factor of less than 2 is considered good. FIG. 14 illustrates the G-factor for an axial slice along the axial plane 234 in the left to right direction. FIG. 15 illustrates the G-factor for an axial slice along the axial plane 234 in the anterior to posterior direction. FIG. 16 illustrates the G-factor for a sagittal slice along the sagittal plane 238 in the anterior to posterior direction. FIG. 17 illustrates the G-factor for a sagittal slice along the sagittal plane 238 in the superior to inferior direction. In FIGS. 14-17, the G-factor was below 2 up to at least R=3 for slices along the various planes and in the various directions. In some cases the G-factor was below 2 up to R=4. FIGS. 14-17 illustrate that the topology of the RF receiving array assembly 236 maximizes acceleration in all directions (e.g., up to R=3).

FIGS. 18-20 illustrate perspective views of the RF coil array 180 having stretchable loops 184. In general, the RF coil 182 and its loops 184 are as described above. The RF coil 180 in FIGS. 25-27 are configured to stretch (e.g., due to having a liquid metal conductor or a meandering trace). This enables the RF coil array to better conform about the subject to be imaged. FIG. 18 illustrates the loops 184 in a relaxed state. FIG. 19 illustrates the loops 184 in a stretched state. FIG. 20 illustrates the loops 184 in a partially stretched state. Each loop 184 of the RF coil 182 is arranged with a zig-zag pattern along the outline of the elliptical shape of the loop 184. The angles along the zig-zag pattern are rounded. The design for coils configured to stretch can be utilized in any topology for an RF coil 182 where it is desirable for a portion of the coil 182 to be stretched.

Technical effects of the disclosed embodiments include providing for an RF receiving array or array assembly that includes a topology that maximizes acceleration in all directions (e.g., up to R=3). An RF receiving array includes an RF coil having 8 elliptical loops having 3 different eccentricities, where each loop has the same perimeter. Each loop having the same perimeter simplifies loop management (e.g., manufacturing, tuning, service, etc.). In addition, the loops have a distributed capacitance construction. In particular, the RF coil is made of a coaxial conductor having a cross-section configured to generate exact capacitance for loop tuning at a specific frequency (e.g., 21.29 MHz). The loops include increased transparency and reliability and are light weight compared to typical RF coils. The RF receiving array assembly may include a 16 channel topology to provide the highest combined acceleration. The RF receiving array assembly may be utilized with a low field MRI scanner (less than 1 T) to improve MRI imaging quality.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A radio frequency (RF) receiving coil assembly for a magnetic resonance imaging (MM) system, comprising:
   a flexible enclosure; and
   an RF coil enclosed within the flexible enclosure, wherein the RF coil comprises a plurality of loops, each loop of the plurality of loops having a same perimeter length, wherein the plurality of loops comprises 3 different eccentricities.

2. The RF receiving coil assembly of claim 1, wherein plurality of loops has 8 loops.

3. The RF receiving coil assembly of claim 1, wherein each loop of the plurality of loops has distributed capacitance.

4. The RF receiving coil assembly of claim 1, wherein the flexible enclosure comprises a rectangular shape.

5. The RF receiving coil assembly of claim 4, wherein the flexible enclosure comprises a square shape.

6. The RF receiving coil assembly of claim 1, wherein the flexible enclosure comprises a hole located within one or more loops of the plurality of loops, wherein the hole is configured to enable the flexible enclosure to stretch.

7. The RF receiving coil assembly of claim 1, wherein each loop partially overlaps with at least two other loops of the plurality of loops.

8. The RF receiving coil assembly of claim 1, wherein the RF receiving coil assembly is configured to be utilized during an accelerated scan with an acceleration factor of up to 3.

9. The RF receiving coil assembly of claim 1, wherein the MRI system is configured to operate with a magnetic field strength of less than 1 Tesla.

10. A radio frequency (RF) coil array assembly for a magnetic resonance imaging (MRI) system, comprising:
    a first RF coil comprising a first plurality of loops, each loop of the first plurality of loops having a first same perimeter length; and
    a second RF coil comprising a second plurality of loops, each loop of the second plurality of loops having a second same perimeter length, wherein at least the first plurality of loops or the second plurality of loops comprises 3 different eccentricities.

11. The RF coil array assembly of claim 10, comprising a first flexible enclosure and a second flexible enclosure separate from the first flexible enclosure, wherein the first RF coil is enclosed with the first flexible enclosure to form a first RF coil array and the second RF coil is enclosed within the second flexible enclosure to form a second RF coil array.

12. The RF coil array assembly of claim 11, wherein the first RF coil array and the second RF coil array are configured to operate as a posterior array and anterior array, respectively, when disposed on a subject and utilized during an imaging scan with the MRI system.

13. The RF coil array assembly of claim 10, wherein the first plurality of loops and the second plurality of loops each have a same number of loops.

14. The RF coil array assembly of claim 13, wherein the first plurality of loops and the second plurality of loops each have 8 loops.

15. The RF coil array assembly of claim 13, wherein the first plurality of loops and the second plurality of loops have a same topology.

16. The RF coil array assembly of claim 13, wherein the first plurality of loops and the second plurality of loops have a different topology.

17. The RF coil array assembly of claim 13, wherein the first same perimeter length and the second same perimeter length are the same.

18. A magnetic resonance imaging (MRI) system, comprising:
   an imaging portion having a radio frequency (RF) receiving coil, wherein the RF receiving coil comprises a plurality of loops, each loop of the plurality of loops having a same perimeter length, wherein the plurality of loops comprises 3 different eccentricities;
   wherein the MM system is configured to operate with a magnetic field strength of less than 1 Tesla.

19. The Mill system of claim 18, wherein the plurality of loops has 8 loops.

* * * * *